(12) United States Patent
Han et al.

(10) Patent No.: US 10,661,408 B2
(45) Date of Patent: May 26, 2020

(54) PLATEN STOPPER

(71) Applicant: Taiwan Semiconductor Manufacturing Co., Ltd., Hsin-Chu (TW)

(72) Inventors: Yu-Feng Han, Hsin-Chu (TW); Cheng-Yi Huang, Hsin-Chu (TW); Fang-Chi Chien, Hsinchu (TW); Chen-shih Chung, Hsin-Chu (TW); Sheng-Tai Peng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 153 days.

(21) Appl. No.: 15/882,511

(22) Filed: Jan. 29, 2018

(65) Prior Publication Data

US 2019/0061094 A1    Feb. 28, 2019

Related U.S. Application Data

(60) Provisional application No. 62/552,527, filed on Aug. 31, 2017.

(51) Int. Cl.
| | | |
|---|---|---|
| *B24B 37/04* | (2012.01) | |
| *B24B 37/24* | (2012.01) | |
| *B24B 57/02* | (2006.01) | |
| *H01L 21/321* | (2006.01) | |
| *B24B 37/10* | (2012.01) | |
| *B24B 37/013* | (2012.01) | |
| *B24B 37/12* | (2012.01) | |
| *B24B 37/20* | (2012.01) | |
| *H01L 21/768* | (2006.01) | |

(52) U.S. Cl.
CPC .......... *B24B 37/042* (2013.01); *B24B 37/013* (2013.01); *B24B 37/105* (2013.01); *B24B 37/12* (2013.01); *B24B 37/205* (2013.01); *B24B 37/245* (2013.01); *B24B 57/02* (2013.01); *H01L 21/3212* (2013.01); *H01L 21/7684* (2013.01)

(58) Field of Classification Search
CPC ..... B24B 37/042; B24B 37/245; B24B 57/02; H01L 21/3212; H01L 21/7684
See application file for complete search history.

(56) References Cited

U.S. PATENT DOCUMENTS

| | | | | |
|---|---|---|---|---|
| 6,443,810 | B1* | 9/2002 | Shih ....................... | B24B 37/16 451/285 |
| 6,533,864 | B1* | 3/2003 | Matsuyama ........ | H01L 21/6715 118/500 |
| 6,589,338 | B1* | 7/2003 | Nakamori ......... | H01L 21/67051 118/50 |
| 6,872,280 | B2* | 3/2005 | Tanaka .................... | B24B 57/02 156/345.12 |
| 8,951,359 | B2* | 2/2015 | Inada ................ | H01L 21/67051 134/26 |
| 2001/0003700 | A1* | 6/2001 | Mizuno .................. | B24B 37/04 451/87 |

\* cited by examiner

*Primary Examiner* — Dung Van Nguyen
(74) *Attorney, Agent, or Firm* — Duane Morris LLP

(57) ABSTRACT

A stopper includes a head portion sized and configured to be coupled to an upper platen of a chemical-mechanical planarization system and a stopper leg sized and configured to direct a flow of liquid slurry applied to an upper planar surface of the upper platen substantially away from a lower surface of the upper platen.

17 Claims, 5 Drawing Sheets

PLATEN STOPPER

CROSS-REFERENCE TO RELATED APPLICATION

This application claims benefit to U.S. Provisional Appl. Ser. No. 62/552,527, filed Aug. 31, 2017, and entitled "PLATEN STOPPER," which is incorporated by reference herein in its entirety.

BACKGROUND

Chemical-mechanical polishing (CMP) processes are commonly used to planarize surfaces of insulating film and conductive film on a semiconductor substrate during semiconductor formation. Polishing of material such as silicon, silicon dioxide, tungsten, copper, aluminum, etc., is commonly accomplished using a polishing pad in combination with a suitable polishing slurry. A wafer carrier is used to hold a wafer such that the wafer faces the polishing pad as the polishing slurry is dispersed onto a surface of the wafer to be polished. The polishing pad is typically supported by a rotary and/or linear moving platen.

The polishing slurry is a liquid slurry that can penetrate various portions of the platen and/or the drive system. Thus, the polishing slurry can cause electrical and/or mechanical errors and degradation of systems disposed within and/or on the platen. Furthermore, electrical and mechanical degradation can result in failure of the CMP process, and adversely impact an end point detection function and/or a removal rate of material from the wafer.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

Figure 1:
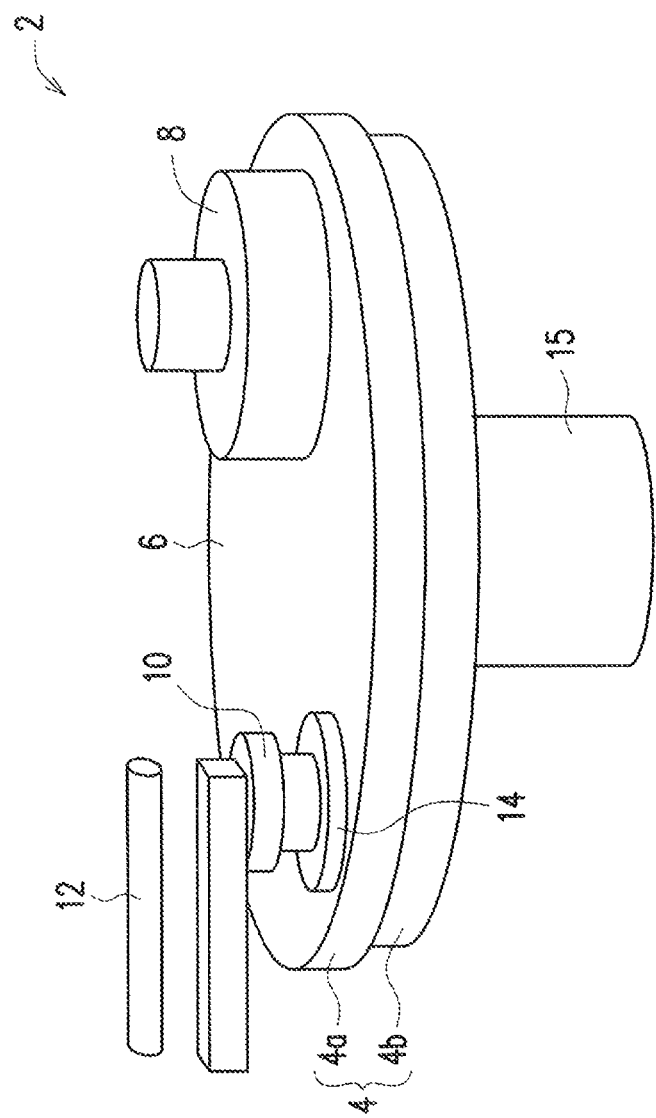
FIG. 1 illustrates a CMP wafer processing system, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first wafer" described in connection with a first figure may not necessarily corresponding to a "first wafer" described in connection with another figure.

In various embodiments, a stopper configured to couple to a platen of a CMP wafer processing system is disclosed. The stopper includes a body configured to couple to a platen of the CMP wafer processing system. The stopper is coupled to a lower surface of a portion of the platen such that the stopper is positioned along a flow path of a liquid slurry applied to an upper planar surface of the platen by the CMP water processing system. The body of the stopper is sized and configured to direct a flow of liquid slurry away from the lower surface of the platen and/or a space in the platen. In some embodiments, the stopper includes a head coupled to a stopper leg. The head is configured to couple the stopper to the platen. The stopper leg is sp is configured to direct the flow of liquid slurry in a predetermined direction substantially away from the lower surface of the platen and/or a space in the platen.

FIG. 1 illustrates a CMP wafer processing system 2, in accordance with some embodiments. The CMP wafer processing system 2 includes a platen 4 having an upper platen 4a and a lower platen 4b. The lower platen 4b is coupled to a rotation shaft 15 by a bearing 26 (see FIG. 2). The upper platen 4a has an upper surface configured to support a pad 6 thereon. The pad 6 is rotated on the upper platen 4a. During rotation, a portion of the pad 6 passes beneath a head 8. The head 8 is configured to support a wafer (not shown) in contact with the pad 6 such that the pad 6 exerts polishing force on the wafer to remove a predetermined amount of material from the surface of the wafer during each rotation.

In some embodiments, a pad conditioner 10 is configured to condition the surface of the pad 6. The pad conditioner 10 includes a pad conditioning surface 14 in contact with the pad 6. The conditioning surface 14 is configured to treat the pad 6 prior to application of the pad 6 to the wafer. In some embodiments, a liquid dispenser 12 is configured to dispense a liquid slurry onto the pad 6 prior to and/or simultaneous with conditioning of the pad 6 by the pad conditioner 10. In some embodiments, the liquid slurry is water, although it will be appreciated that any suitable liquid slurry can be dispensed onto the surface of the pad 6. In some embodiments, the liquid slurry is water, although it will be appreciated that any suitable liquid slurry can be dispensed onto the surface of the pad 6, such as a slurry containing one or more surfactants, chemical etchants and colloid particles. Examples of suitable ingredients for slurries include, but are not limited to, silica, alumina, ceria ($CeO_2$) suspended in an aqueous solution. The liquid slurry flows over the upper planar surface and down the sides of the upper platen 4a. In some embodiments the liquid slurry flows over a lower planar surface of the upper platen 4a.

Figure 2:
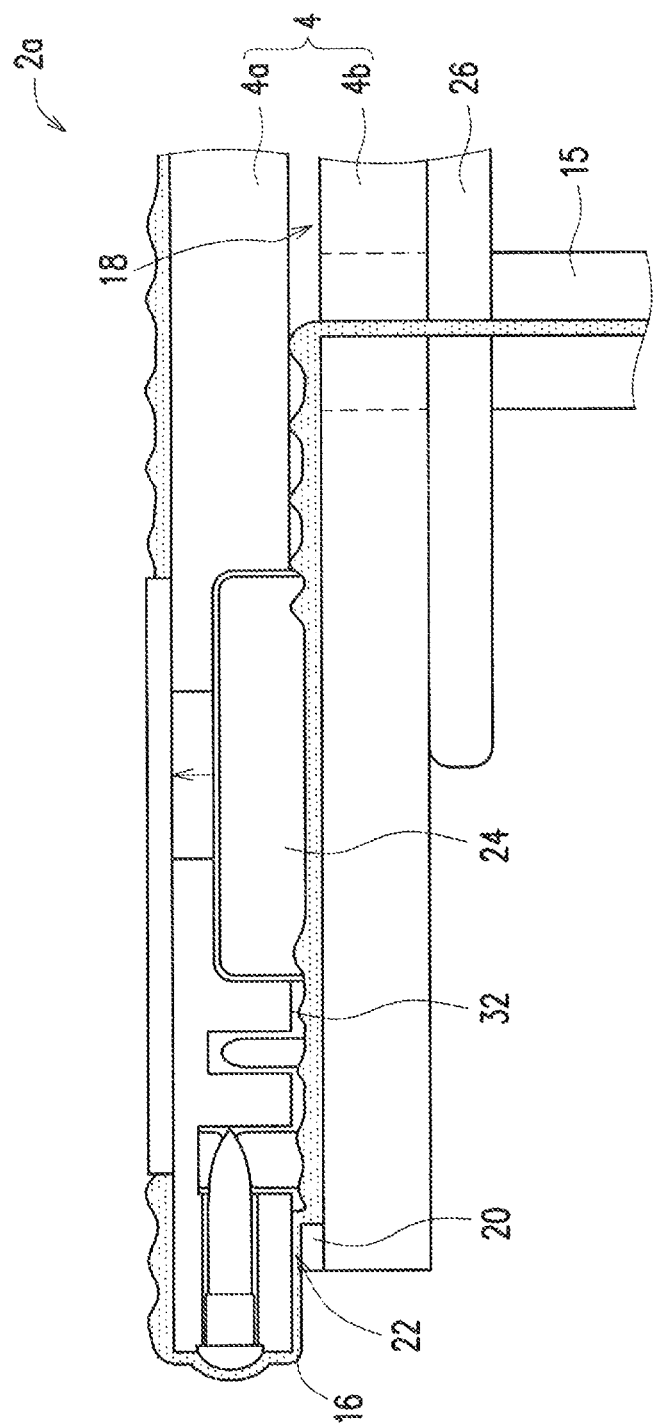
FIG. 2 illustrates a CMP wafer processing system having a failed O-ring, in accordance with some embodiments.

FIG. 2 illustrates a side cross-section of a CMP wafer processing system 2a, in accordance with some embodiments. The CMP wafer processing system 2a is similar to the CMP wafer processing system 2 discussed above, and similar description is not repeated herein: The CMP wafer processing system 2a includes a platen 4 having a space 18 between the upper platen 4a and the lower platen 4b. An O-ring 20 is positioned at an edge of the lower platen 4b to prevent liquid slurry 16 from flowing along a lower planar surface 32 of the upper platen 4a and into the space 18. As shown in FIG. 2, during use, the O-ring 20 can fail and allow liquid slurry 16 to flow into the space 18, for example, through a channel 22 above the O-ring 20, although it will be appreciated that failure of the O-ring 20 can result in an opening above, below, and/or through the O-ring 20 such that liquid slurry 16 can flow into the space 18 between the upper platen 4a and the lower platen 4b. The liquid slurry 16 causes electrical and/or mechanical damage to one or more elements of the CMP wafer processing system 2a. For example, the liquid slurry can damage an end-point detector 24, a bearing 26, and/or other elements of the CMP wafer processing system 2a positioned between the upper platen 4a and the lower platen 4b, The electrical and/or mechanical damage can cause one or more functions of the CMP wafer processing system 2a to fail, such as the end-point detection function of the platen 4. The electrical and/or mechanical damage can further cause unstable removal rates, effect rotation speed, and/or otherwise render the CMP wafer processing system 2a non-functional.

Figure 3:
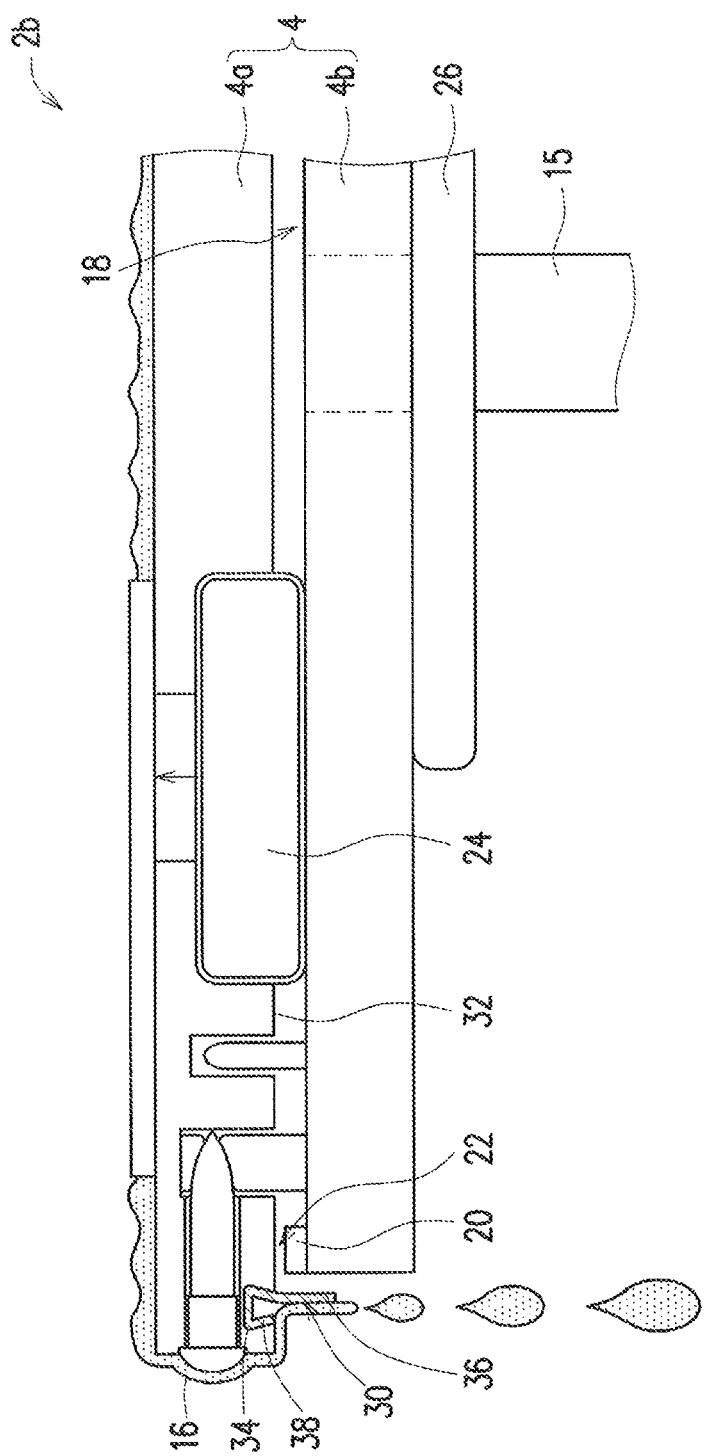
FIG. 3 illustrates a CMP wafer processing system including a stopper, in accordance with some embodiments.

FIG. 3 illustrates a side cross-section of a CMP wafer processing system 2b including a stopper 30, in accordance with some embodiments. The CMP wafer processing system 2b is similar to the CMP wafer processing system 2 discussed above, and similar description is not repeated herein. The CMP wafer processing system 2b includes a stopper 30 coupled to a lower planar surface 32 of the upper platen 4a. In the illustrated embodiment, at least a portion the stopper 30 (such as a head portion 38 as described in greater detail with respect to FIGS. 4-5) is positioned within a cavity 34 extending from a lower planar surface 32 into the upper platen 4a. The cavity 34 is sized and configured to retain the stopper 30 in a friction engagement. Although embodiments are discussed herein including a friction engagement, it will be appreciated that any suitable coupling mechanism such as an adhesive, a fastener, and/or any other suitable mechanism. (or combination of mechanisms) can be used to couple the stopper 30 to the lower surface 30 of the upper platen 4a.

In some embodiments, the stopper 30 includes a body 36 configured to direct a flow of liquid slurry 16 substantially away from the space 18 defined between the upper platen 4a and the lower platen 4b. For example, the body 36 can include one or more legs extending at all angle with respect to a horizontal axis of the body 36 (as discussed in greater detail with respect to FIGS. 4A-5B) and configured to direct a flow of liquid substantially away from a lower planar surface 32 of the upper platen 4a and/or the space 18 between the upper platen 4a and the lower platen 4b. Although specific embodiments are discussed herein, it will be appreciated that the stopper 30 can include additional and/or alternative body shapes or elements configured to direct the flow of liquid slurry 16 substantially away from the lower planar surface 32 of the upper platen 4a and/or the space 18 between the upper platen 4a and the lower platen 4b.

In some embodiments, the stopper 30 is configured to increase a useable life span of the platen 4. The stopper 30 is configured to prevent liquid slurry 16 from flowing into the space 18 between the upper platen 4a and the lower platen 4b. By preventing liquid slurry 16 from flowing into the space 18, the stopper 30 prevents electrical and/or mechanical damage to the elements positioned between the upper platen 4a and the lower platen 4b caused by contact with the liquid slurry 16. The stopper 30 increases the useable operational time of the platen 4 (for example, by decreasing failure rates), reduces load on equipment engineers with respect to maintenance and replacement of the platen 4, and/or prolongs the life of the platen 4.

In some embodiments, the stopper 30 is replaceable, unlike the O-ring 20. The stopper 30 can be replaced when degraded and/or damaged without needing to replace the entire platen 4, increasing the operational life of the platen 4. For example, in some embodiments, the stopper 30 can be removed from the cavity 34 by applying a first predetermined force to the stopper 30, such as a predetermined force directed away from the lower planar surface 32 of the upper platen 4a. A second stopper 30 can be inserted into the cavity 34 by applying a second predetermined force, such as a predetermined force directed towards the lower planar surface 32. The second predetermined force causes a portion of the stopper 30 (such as a head portion) to be inserted into the cavity 34.

Figure 4A:
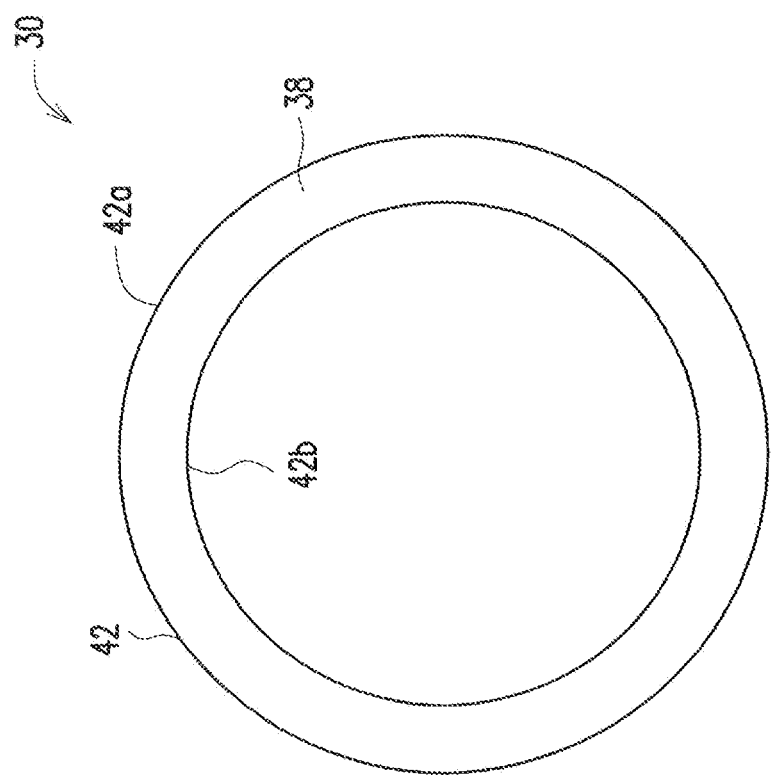
FIG. 4A illustrates a top view of a stopper, in accordance with some embodiments.
Figure 4B:
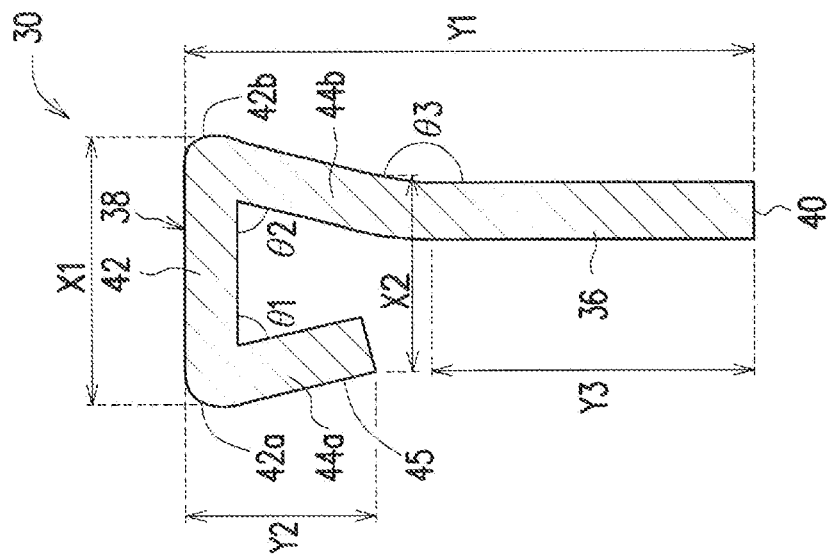
FIG. 4B illustrates a cross-sectional view of the stopper of FIG. 4A, in accordance with some embodiments.

FIGS. 4A-4B illustrates a stopper 30 having non-parallel side legs 44a, 44b, in accordance with some embodiments. The stopper 30 includes a circumferential body 36 configured to couple to an upper platen 4a and direct a flow of liquid slurry 16 substantially away from the lower surface 32 of the upper platen 4a and/or the space 18 between the upper platen 4a and the lower platen 4b. Although embodiments are discussed herein having a circumferential body 36, it will be appreciated that the stopper 30 can include any suitable closed body shape, such as, for example, a geometric shape (e.g., square, circle, oval, triangle, etc.) and/or a non-geometric shape having a closed perimeter.

The circumferential body 36 includes a head portion 38 and a stopper leg 40. The head portion 38 includes a top section 42 extending substantially along a radial axis 43 from a first end 42a to a second end 42b. A first side leg 44a extends from the first end 42a of the top section 42 and a second side leg 44b extends from a second end 42b of the top section 42. Although embodiments are discussed herein including a top portion 42 extending along a radial axis 43, it will be appreciated that the top portion 42 can extend along any suitable axis (such as a horizontal axis, a longitudinal axis, etc.) such that the top portion defines a planar surface having a closed perimeter, and is within the scope of this disclosure.

In various embodiments, the stopper 30 includes one or more materials configured to redirect the liquid slurry 16 and configured to minimize degradation of the stopper 30 caused by interaction with the liquid slurry 16. For example, in various embodiments, the stopper 30 can include one or more of polyether ether ketone (PEEK), polyphenylene sulfide (PPS), polytetrafluoroethylene (PTFE), polyoxymethylene (POM), any other suitable material, and/or any combination thereof.

In some embodiments, the first side leg 44a extends from the first end 42a of the top section 42 at a first angle $\Theta_1$ and the second side leg 44b extends from the second end 42b of the top section 42 at a second angle $\Theta_2$. In some embodiments, the first angle $\Theta_1$ and/or the second angle $\Theta_2$ are substantially equal to or less than 90° with respect to the radial axis 43 of the top section 42. For example, in the illustrated embodiment, the first side leg 44a and the second side leg 44b each extend at an angle (respectively $\Theta_1$ and $\Theta_2$) less than 90° with respect to the top section 42, although it will be appreciated that greater and/or lesser angles are possible and are within the scope of this disclosure. In some embodiments, the first angle $\Theta_1$ is equal to the second angle $\Theta_2$. In other embodiments, the first angle $\Theta_1$ and the second angle $\Theta_2$ are different.

In some embodiments, the head portion 38 is sized and configured to be received within the cavity 34 extending from the lower planar surface 32 into the upper platen 4a (see FIG. 3). The head portion 38 includes a shape complimentary to the cavity 34 such that the stopper 30 is retained within the cavity 34 by a friction coupling. It will be appreciated that dimensions of the stopper 30 are related to and/or depend on the dimensions, construction, and/or design of the upper platen 4a and/or the lower platen 4b. For example, in the illustrated embodiment, the head portion 38 has a first width $X_1$ at the top section 42 and a second width $X_2$ between a free end 45 of the first side leg 44a and the second side leg 44b. The second width $X_2$ is less than the first width $X_1$. The first width $X_1$ can be any suitable width, for example, within a range of about 2-8 mm, such as 2 mm, 3 mm, 4 mm, 5 mm, 6 mm, 8 mm, 2-6 mm, 3-5 mm, and/or any other suitable width. The second width $X_2$ can be any suitable width, for example, within a range of about 1-7 mm, such as 1 mm, 2 mm, 3 mm, 4 mm, 5 mm, 6 mm, 2-6 mm, 3-5 mm, and/or any other suitable width. For example, in some embodiments, the first width $X_1$ is substantially equal to about 4 mm and the second width $X_2$ is substantially equal to about 3 mm, although it will be appreciated that these values are provided only as an example and are not limiting.

In some embodiments, the first and second widths $X_1$ and $X_2$ are limited by a size difference between the upper platen 4a and the lower platen 4b. For example, in some embodiments, upper platen 4a extends circumferentially beyond the lower platen 4b. The first width $X_1$ of the stopper 30 is limited to a width less than the difference between the upper platen 4a and the lower plate 4b to prevent the stopper 30 from interacting with the lower plate 4b. In some embodiments, the upper platen 4a extends about 6-7 mm beyond the lower platen 4b, although it will be appreciated that the upper platen 4a can extend any suitable amount beyond the lower platen 4b based on the design, tolerances, etc. of the CMP wafer processing system 2b.

In some embodiments, the first side leg 44a and the second side leg 44b are compressible to reduce a width of the head portion 38 during insertion of the head portion 38 into the cavity 34. For example, in some embodiments, the free end 45 of the first side leg 44a is spaced apart from the second side leg 44b and can be compressed by a force towards the second side leg 44b. The compressive force reduces a width of the head portion 38 (such as the width $X_1$ or $X_2$) to allow for insertion of head portion 38 into the cavity 34. In some embodiments, the cavity 34 has a width less than the width of the head portion 38 such that the cavity 34 maintains the head portion 38 in a partially compressed state after insertion. It will be appreciated that the width of the cavity 34 and/or the head portion 38 is selected such that the stopper 30 can be installed in the cavity 34 and retained therein during operation. For example, in some embodiments, the cavity 34 is configured to retain the stopper 30 through a centrifugal force, gravity, and/or any other force applied during operation.

In some embodiments, a stopper leg 40 is coupled to the second side leg 44b. The stopper leg 40 extends from the second side leg 44h at a third angle $\Theta_3$. In some embodiments, the third angle $\Theta_3$ is selected such that the stopper leg 40 extends substantially perpendicular to the top section 42. The stopper leg 40 extends a predetermined length from the second side leg 44b such that the stopper leg 40 extends below a lower planar surface 32 of the upper platen 4a when the stopper 30 is coupled to the upper platen 4a, for example, by inserting the head portion 38 of the stopper 30 into the cavity 34 defined in the upper platen 4a. The stopper leg 40 is configured to interact with and redirect a flow of liquid slurry 16. The stopper leg 40 redirects the flow of liquid slurry 16 in a direction that is substantially away from the lower planar surface 32 and/or the space 18 between the upper platen 4a and the lower platen 4b. For example, in some embodiments, the stopper leg 40 redirects the flow of liquid slurry 16 in a direction substantially perpendicular to the lower planar surface 32, although it will be appreciated that the stopper leg 40 can redirect the flow of liquid slurry 16 in any direction substantially away from the lower planar surface 32 and/or the space 18. In some embodiments, the stopper leg 40 has a predetermined spacing with respect to the lower platen 4b to prevent capillary action between the stopper leg 40 and the lower platen 4b. The predetermined spacing can be any suitable spacing. For example, in some embodiments, a minimum spacing of 2 mm is maintained between the stopper leg 40 and the lower platen 4b, although it will be appreciated that a greater and/or lesser minimum spacing can be maintained based on the design of the stopper 30 and/or the lower platen 4b.

In some embodiments, the stopper leg 40 comprises a majority of the overall height of the stopper 30. For example, in some embodiments, the stopper 30 has an overall height $Y_1$, a head portion 38 having a height $Y_2$, and a stopper leg 40 having a height $Y_3$. In various embodiments, the height $Y_1$ can be any suitable height, for example, a height in a range of 6-12 mm, such as 6 mm, 7 mm, 8 mm, 9 mm, 10 mm, 12 mm, 8-12 mm, and/or any other suitable height. In various embodiments, the height $Y_2$ can be any suitable height, for example, a height in a range of 1-5 mm, such as 1 mm, 2 mm, 3 mm, 4 mm, 5 mm, and/or any other suitable height. In various embodiments, the height $Y_3$ can be any suitable height, for example, a height in a range of 1-5 mm, such as 1 mm, 2 mm, 3 mm, 4 mm, 5 mm, and/or any other suitable height. Although specific heights and/or ranges are discussed herein, it will be appreciated that these values are provided only as examples and that any of the heights $Y_1$, $Y_2$, and/or $Y_3$ can have a greater and or lesser value and that each of the heights $Y_2$ and/or $Y_3$ can make up a greater and/or lesser portion of the overall height $Y_1$. For example, in some embodiments, the overall height $Y_1$ can be divided substantially evenly between the height $Y_2$ of the head portion 38 and the height $Y_3$ of the stopper leg 40, while in other embodiments the overall height $Y_1$ can be divided substantially unevenly between the height $Y_2$ of the head portion 38 and the height $Y_3$ of the stopper leg 40 such that one of height $Y_2$ or height $Y_3$ includes a majority of the overall height $Y_1$.

In some embodiments, the first side leg 44a, the second side leg 44b, and/or the stopper leg 40 are configured to direct a flow of liquid slurry 16 from a first direction substantially parallel to the lower planar surface 32 to a second direction substantially perpendicular to the lower planar surface 32. For example, as shown in FIG. 3, in some embodiments, the stopper leg 40 is configured to interact with a flow of liquid slurry 16 and redirect the liquid slurry 16 along a length of the stopper leg 40 and perpendicular to the lower planar surface 32. The redirected liquid slurry 16 flows down the length of the stopper leg 40 and off of the distal end of the stopper leg 40. The redirected liquid slurry 16 is prevented from entering the space 18 between the upper platen 4a and the lower platen 4b. In other embodiments, the first side leg 44a and/or the second side leg 44b can extend a predetermined distance below the lower planar surface 32 of the upper platen 4a such that the first side leg 44a and/or the second side leg 44b redirect the flow of liquid slurry 16 at a first angle with respect to the lower planar surface 32 that is less than 90°. The stopper leg 40 is configured to receive the redirected flow from the first side leg 44a and/or the second side lea 44b and further redirect the flow at a second angle with respect to the lower platen surface 32 such that the flow of liquid slurry 16 is substantially perpendicular to the lower platen surface 32 after being redirected by the stopper leg 40.

Figure 5B:
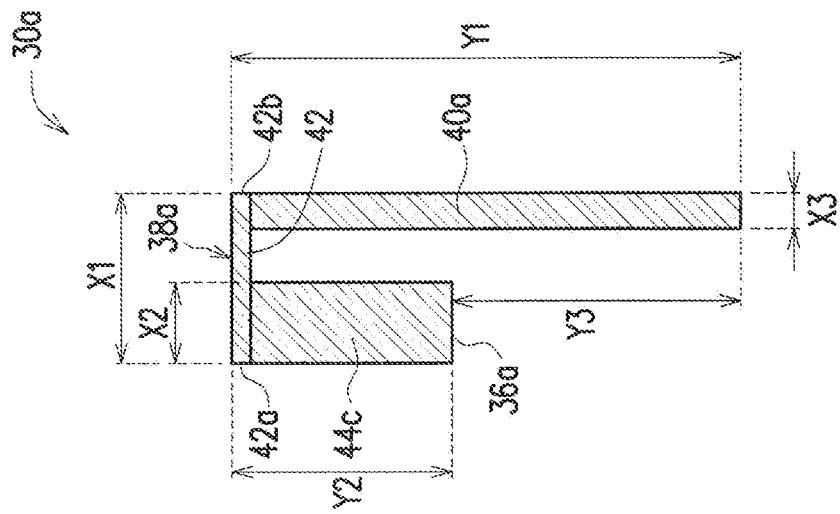
FIG. 5B illustrates a cross-sectional view of the stopper of FIG. 5A, in accordance with some embodiments.
Figure 5A:
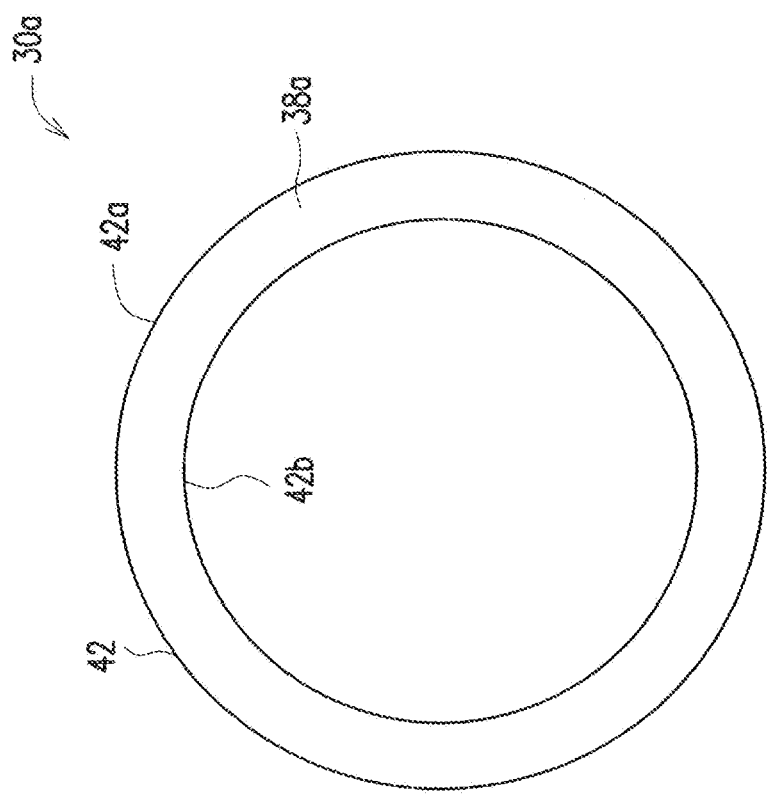
FIG. 5A illustrates a top view of a stopper including parallel legs, in accordance with some embodiments.

FIGS. 5A-5B illustrates a stopper 30a having parallel legs 40a, 44c, in accordance with some embodiments. The stopper 30a is similar to the stopper 30 discussed above with respect to FIGS. 3-4, and similar description is not repeated herein. The stopper 30a includes a first side leg 44c extending from the first end 42a of the top section 42 and a stopper leg 40a extending from a second end 42b of the top section 42. Each of the first leg 44c and the stopper leg 40a extend substantially perpendicular to the top section 42. The stopper leg 40a extends a predetermined length such that at least a portion of the stopper leg 40a extends beyond the lower planar surface 32 of the upper platen 4a when the stopper 30a is coupled to the upper platen 4a, for example, by inserting a portion of the stopper 30a into a cavity 34 defined in the upper platen 4a.

In some embodiments, the first side leg 44c, a first section of the stopper leg 40a, and/or the top section 42 are sized and configured to retain the stopper 30a within a cavity 34 defined in an upper platen 4a. For example, in the illustrated embodiment, the head portion 38a has a height $Y_2$ and a width $X_1$. The first side leg 44c, the top section 42, and/or a first section of the stopper leg 40a having a height equal $Y_2$ are sized and configured to be received within a cavity 34 and maintained therein by one or more of a friction fit, an adhesive, and/or a fastener. In some embodiments, the width $X_1$ of the head portion 38a is greater than a width of the cavity 34 such that the cavity 34 applies a compressive force to the stopper 30a when the stopper 30 is inserted into the cavity 34. For example, in some embodiments, the head portion 38a has a width $X_1$ of about 3 mm, although it will be appreciated that the head portion 38a can have a greater and/or lesser width $X_1$. The compressive force maintains the stopper 30a in a friction engagement. In some embodiments, an adhesive is applied between an inner surface of the cavity 34 and the stopper 30.

In some embodiments, a width $X_2$ of the first side leg 44c is greater than a width $X_3$ of the stopper leg 40a. For example, in some embodiments, the first side leg 44c has a width $X_2$ of about 1.4 mm and the stopper leg 40a has a width of about 0.4 mm. In other embodiments, the width $X_2$ of the first side leg 44c and the width $X_3$ of the stopper leg 40a are substantially equal. Although specific embodiments are discussed herein, it will be appreciated that the first side leg 44c and/or the stopper leg 40a can have any suitable width less than the width $X_1$ of the head portion 38a and is within the scope of this disclosure.

In some embodiments, a second section of the stopper leg 40a is configured to extend beyond the lower planar surface 32 of the upper platen 4a to redirect the flow of liquid slurry 16 substantially away from the lower planar surface 32 and/or a space 18 defined between the upper platen 4a and the lower platen 4b. The second section of the stopper leg 40a has a height $Y_3$ equal to the total height $Y_1$ of the stopper 30a minus the height $Y_2$ of the first section. In some embodiments, the height $Y_3$ is sufficient to extend beyond the lower planar surface 32 of the upper platen 4a and to redirect the flow of liquid slurry 16 in a direction substantially perpendicular to the lower planar surface 32. For example, in some embodiments, the stopper 30a has a height $Y_1$ of about 8 mm, the head portion 38a has a height of about 4.3 mm, and the stopper leg 40a extends a height $Y_3$ of about 3.7 mm below the head portion 38a. Although specific embodiments are discussed herein, it will be appreciated that the stopper 30a, the head portion 38a, and/or the stopper leg 40a can have any suitable heights $Y_1$, $Y_2$, $Y_3$ and are within the scope of this disclosure.

In various embodiments, a stopper is disclosed. The stopper includes a head portion sized and configured to be coupled to an upper platen of a chemical-mechanical planarization system and a stopper leg sized and configured to direct a flow of liquid slurry applied to an upper planar surface of the upper platen substantially away from a lower surface of the upper platen.

In various embodiments, a system is disclosed. The system includes a chemical-mechanical planarization (CMP) tool. The CMP tool includes a platen having an upper planar surface and a lower surface and a dispenser configured to apply a liquid slurry to the upper planar surface of the platen. A stopper includes a head portion sized and configured to be coupled to the lower surface of the platen and a stopper leg sized, and configured to direct a flow of liquid slurry applied by the dispenser substantially away from the lower surface of the upper platen.

In various embodiments, a stopper is disclosed. The stopper includes a head portion sized and configured to be coupled to an upper platen of a chemical-mechanical planarization system. The head portion includes a top section extending from a first end to a second end, a first side leg extending at a first angle from the first end of the top section, and a second side leg extending at a second angle from the second end of the top section. The first angle and the second angle are less than 90°. A stopper leg is sized and configured to direct a flow of liquid slurry applied to an upper planar surface of the upper platen substantially away from a lower surface of the upper platen. The stopper leg extends from the second side leg at a third angle such that the stopper leg extends substantially perpendicular to the top section of the head portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stopper for a wet platen, comprising:
a head portion sized and configured to be coupled to an upper platen of a chemical-mechanical planarization system, wherein the head portion is tapered; and
a stopper leg extending from the head portion, wherein the stopper leg is sized and configured to direct a flow of liquid slurry applied to an upper planar surface of the upper platen substantially away from a lower surface of the upper platen.

2. The stopper of claim 1, wherein the head portion comprises:
a top section extending from a first end to a second end; and
a first side leg extending at a first angle from the first end of the top section.

3. The stopper of claim 2, wherein the first angle is equal to 90°.

4. The stopper of claim 2, wherein the stopper leg extends at the second end of the top section.

5. The stopper of claim 2, comprising a second side leg extending at a second angle from the second end of the top section.

6. The stopper of claim 5, wherein the second angle is equal to the first angle.

7. The stopper of claim 5, wherein the stopper leg extends from the second side leg at a third angle such that the stopper leg is substantially perpendicular to the top section of the head portion.

8. The stopper of claim 1, wherein the head portion is sized and configured to be received within a cavity defined in the lower surface of the upper platen.

9. The stopper of claim 1, wherein the stopper leg is configured to direct the flow of liquid slurry in a direction substantially perpendicular to the lower surface of the upper platen.

10. A system, comprising:
a chemical-mechanical planarization tool comprising:
a platen having an upper planar surface and a lower surface; and
a dispenser configured to apply a liquid slurry to the upper planar surface of the platen; and
a stopper, comprising:
a head portion sized and configured to be coupled to the lower surface of the platen; and
a stopper leg sized and configured to direct a flow of liquid slurry applied by the dispenser substantially away from the lower surface of the upper platen, wherein the platen defines a cavity extending from the lower surface into the platen, and wherein the head portion of the stopper is sized and configured to be received within the cavity, and wherein the cavity is tapered from an inner portion to an opening formed in the lower surface, and wherein the head portion has a complimentary taper.

11. The system of claim 10, wherein head portion comprises:
a top section extending from a first end to a second end; and
a first side leg extending at a first angle from the first end of the top section.

12. The system of claim 11, wherein the first angle is equal to 90°.

13. The system of claim 11, wherein the stopper leg extends from the second end of the top section.

14. The system of claim 11, comprising a second side leg extending from the second end of the top section, wherein the stopper leg extends from the second side leg at a third angle.

15. The system of claim 10, wherein the stopper leg extends substantially perpendicular to the lower surface of the platen.

16. The system of claim 10, wherein the stopper leg is configured to direct the flow of liquid slurry in a direction substantially perpendicular to the lower surface of the upper platen.

17. A stopper, comprising:
a head portion sized and configured to be coupled to an upper platen of a chemical-mechanical planarization system, the head portion comprising:
a top section extending from a first end to a second end;
a first side leg extending at a first angle from the first end of the top section; and
a second side leg extending at a second angle from the second end of the top section, wherein the first angle and the second angle are less than 90°; and
a stopper leg sized and configured to direct a flow of liquid slurry applied to an upper planar surface of the upper platen substantially away from a lower surface of the upper platen, wherein the stopper leg extends from the second side leg at a third angle such that the stopper leg extends substantially perpendicular to the top section of the head portion.

* * * * *